United States Patent
Ichimura

(10) Patent No.: US 8,106,994 B2
(45) Date of Patent: Jan. 31, 2012

(54) IMAGE PICKUP APPARATUS HAVING A MICROLENS ARRAY

(75) Inventor: Isao Ichimura, Tokyo (JP)

(73) Assignee: Sony Corporation, Tokyo (JP)

( * ) Notice: Subject to any disclaimer, the term of this patent is extended or adjusted under 35 U.S.C. 154(b) by 322 days.

(21) Appl. No.: 12/320,235

(22) Filed: Jan. 22, 2009

(65) Prior Publication Data

US 2009/0190022 A1    Jul. 30, 2009

(30) Foreign Application Priority Data

Jan. 28, 2008 (JP) ................. 2008-016717

(51) Int. Cl.
*H04N 5/225* (2006.01)
*G02B 27/10* (2006.01)

(52) U.S. Cl. .............. 348/340; 348/280; 359/619

(58) Field of Classification Search ................ 348/340
See application file for complete search history.

(56) References Cited

U.S. PATENT DOCUMENTS

| | | | |
|---|---|---|---|
| 6,476,851 B1 * | 11/2002 | Nakamura | 348/65 |
| 7,236,304 B2 * | 6/2007 | Okayama et al. | 359/626 |
| 7,280,146 B2 * | 10/2007 | Takahashi et al. | 348/340 |
| 7,297,919 B2 * | 11/2007 | Mishina et al. | 250/208.1 |
| 7,515,342 B2 * | 4/2009 | Tanaka et al. | 359/619 |
| 2001/0026322 A1 | 10/2001 | Takahashi et al. | |
| 2007/0091197 A1 | 4/2007 | Okayama et al. | |
| 2007/0252074 A1 | 11/2007 | Ng et al. | |
| 2010/0265381 A1 * | 10/2010 | Yamamoto et al. | 348/335 |

FOREIGN PATENT DOCUMENTS

| | | |
|---|---|---|
| JP | 1-213079 A | 8/1989 |
| JP | 2600250 | 1/1997 |
| JP | 10-229180 | 8/1998 |
| JP | 3170847 | 3/2001 |
| WO | WO-2006/039486 A2 | 4/2006 |

OTHER PUBLICATIONS

Reg Ng et al., "Light Field Photography with a Hand-held Plenoptic Camera," Stanford Tech Report CTSR Feb. 2005, pp. 1-12.
Japanese Office Action issued Dec. 9, 2009 for corresponding Japanese Application No. 2008-016717.
Kurachi, Noriko, "Virtual Photography" Technical Frontier No. 21, CG World, vol. 89, Works Co., Ltd., pp. 120-123, Dec. 1, 2005.
Supplemental European Search issued Jun. 5, 2009 for corresponding European Application No. 09 25 0197.

* cited by examiner

*Primary Examiner* — Ngoc-Yen Vu
(74) *Attorney, Agent, or Firm* — Rader, Fishman & Grauer PLLC

(57) ABSTRACT

An image pickup apparatus includes: an image pickup lens section; an image pickup device obtaining image pickup data on the basis of light detected; a microlens array section arranged on a focal plane of the image pickup lens section, and including a plurality of microlenses, each of the microlenses being provided corresponding to a plurality of image pickup pixels of the image pickup device; and a light-condensing section configured of a plurality of light-condensing elements, each of the light-condensing elements condensing light entering into each of the image pickup pixels of the image pickup device, wherein on the image pickup device, in a pixel region corresponding to each microlens, the pitch between the light-condensing elements is smaller than the pixel size, and in a boundary region between pixel regions corresponding to microlenses, respectively, the pitch between the light-condensing elements is larger than the pixel size.

7 Claims, 13 Drawing Sheets

IMAGE PICKUP APPARATUS HAVING A MICROLENS ARRAY

CROSS REFERENCES TO RELATED APPLICATIONS

The present invention contains subject matter related to Japanese Patent Application JP 2008-016717 filed in the Japanese Patent Office on Jan. 28, 2008, the entire contents of which being incorporated herein by reference.

BACKGROUND OF THE INVENTION

1. Field of the Invention

The present invention relates to an image pickup apparatus using a microlens array.

2. Description of the Related Art

Various image pickup apparatuses have been proposed and developed. Image pickup apparatuses performing predetermined image processing on image pickup data obtained by imaging or picking up an image to output the image pickup data have been proposed.

For example, International Patent Publication No. 06/039486 and Ren.Ng, et al. "Light Field Photography with a Hand-Held Plenoptic Camera", Stanford Tech Report CTSR 2005-02, propose image pickup apparatuses using a technique called "Light Field Photography". Such an image pickup apparatus includes an image pickup lens, a microlens array, an image pickup device and an image processing section, and an aperture stop including a single aperture in its central part is included in the image pickup lens. In such a configuration, image pickup data obtained by the image pickup device includes the intensity distribution of light on a light-sensing plane as well as information on the traveling direction of the light. Thereby, the image processing section is capable of reconstructing or reproducing an image viewed from an arbitrary viewpoint or an arbitrary direction (hereinafter simply referred to as a field of view).

An image obtained by a photographic apparatus (a light field camera) embodying the technique by "Light Field Photography" is outputted as an image group in which a plurality of circular images are arranged in an array as illustrated in, for example, FIG. 11 of International Patent Publication No. 06/039486. Such a circular image corresponds to an image (hereinafter referred to a unit image), which is formed on a solid-state image pickup device by each microlens according to an exit pupil shape of a photographing lens.

Moreover, light-sensing sections of a solid-state image pickup apparatus are generally arranged for each of pixels in rows and columns at a predetermined pitch. Since a circuit section such as a transfer region is arranged around the light-sensing section of each of the pixels, so light entering such a region does not contribute to image pickup. Therefore, in most of solid-state image pickup devices, a light-condensing section (such as a light-refracting configuration) condensing light entering a region other than the light-sensing section is arranged to guide the light to the light-sensing section, thereby higher sensitivity is achieved.

In this case, when a light-refracting configuration such as an on-chip lens is arranged directly on each pixel around the optical axis center of an optical system, most of light rays are able to be condensed effectively. However, a main light ray is inclined in a peripheral area away from the optical axis. Therefore, for example, as described in Japanese Patent Nos. 2600250 and 3170847, image height correction is performed so that a pitch between on-chip lenses becomes smaller than a pixel pitch, and that a gap between a center position of the on-chip lens and a pixel center position of each pixel is gradually increased with distance from the optical axis.

SUMMARY OF THE INVENTION

In the above-described "light field camera", a microlens array is arranged in an image plane position of an image pickup lens, so the incident angle of a light ray with respect to a light-refracting configuration having a light-condensing property such as an on-chip lens configured on a light ray incident side of a solid-state image pickup device is largely different from that in the case of an image pickup apparatus in related art. Therefore, as described above, in the case where a solid-state image pickup device in related art in which image height correction is performed is mounted in the "light field camera" directly or without any change, the generation of a luminance gradient in a unit image or a reduction in a signal-to-noise ratio (an S/N ratio) due to a light amount loss may be caused. Therefore, image quality of a picked-up image may decline.

It is desirable to provide an image pickup apparatus capable of improving the image quality of an image on the basis of image pickup data in the case where the image pickup data is obtained so as to include information on the traveling direction of light.

According to an embodiment of the invention, there is provided an image pickup apparatus including: an image pickup lens section; an image pickup device obtaining image pickup data on the basis of light detected; a microlens array section arranged on a focal plane of the image pickup lens section between the image pickup lens section and the image pickup device, and including a plurality of microlenses, each of the microlenses being provided corresponding to a plurality of image pickup pixels of the image pickup device; and a light-condensing section configured of a plurality of light-condensing elements, each of the light-condensing elements condensing light entering into each of the image pickup pixels of the image pickup device, in which on the image pickup device, in a pixel region corresponding to each microlens, the pitch between the light-condensing elements in the light-condensing section is smaller than the pixel size in a predetermined direction in the image pickup pixel, and in a boundary region between pixel regions corresponding to microlenses, respectively, the pitch between the light-condensing elements is larger than the pixel size in the predetermined direction in the image pickup pixel.

In the image pickup apparatus according to the embodiment of the invention, an image of an object subjected to image pickup by the image pickup lens section is formed on the microlens array section. Then, a light ray entering into the microlens array section reaches the image pickup device and is detected by a plurality of image pickup pixels allocated to each microlens, thereby image pickup data including information on the traveling direction of light is obtained. In this case, in each pixel region corresponding to each microlens, the pitch between the light-condensing elements in the light-condensing section is smaller than the pixel size in the predetermined direction in the image pickup pixel, and in a boundary region between pixel regions corresponding to microlenses, respectively, the pitch between the light-condensing elements is larger than the pixel size in the predetermined direction in the image pickup pixel, thereby in a pixel region corresponding to each microlens, a luminance gradient generated between an image pickup pixel around a central region of each of the microlenses and an image pickup pixel around a peripheral region due to inclination of an incident light ray is prevented.

In the image pickup apparatus according to the embodiment of the invention, it is preferable that in each pixel region corresponding to each microlens, the center position of the light-condensing element coincides with the pixel center position of the image pickup pixel in a central region of each of the microlenses, and is gradually shifted from the pixel center position of the image pickup pixel with approach toward a peripheral region of each of the microlenses. In such a configuration, the angle of view of the image pickup lens section and inclination of a main light ray are also considered, so the light-condensing efficiency of the incident light ray in each pixel region is enhanced, and the S/N ratio (signal-to-noise ratio) of image pickup data is further improved.

In the image pickup apparatus according to the embodiment of the invention, in the case where the above-described image pickup lens section includes an aperture stop, the following formula (1) is preferably satisfied. In such a configuration, when the pitch between the microlenses satisfies the following formula (1), image height deviation in a light-sensing plane of the image pickup device is prevented from occurring in image pickup data obtained by the image pickup device. Therefore, when a reconstructed image is formed through the use of such image pickup data, an appropriate reconstructed image may be formed.

$$p=(m \times s) \times \{L/(L+f)\} \qquad (1)$$

where p is a pitch between the microlenses, s is a pixel size in the predetermined direction, m is the number (an integer) of the image pickup pixels allocated to each of the microlenses in the predetermined direction, L is a distance between the aperture stop and the microlens array section, and f is a focal length of each of the microlenses.

In the image pickup apparatus according to the embodiment of the invention, in the case where the above-described image pickup lens section includes an aperture stop, the image pickup apparatus may include an image height correction section performing image height correction on the image pickup data obtained by the image pickup device so that an image size, in the predetermined direction, of an image formed on the image pickup device by each of the microlenses is equal to an integral multiple of a pixel size, in the predetermined direction, of the image pickup pixel. In such a configuration, in image pickup data obtained through the image height correction, image height deviation in a light-sensing plane of the image pickup device does not occur irrespective of the position of the aperture stop. Therefore, when a reconstructed image is obtained through the use of image pickup data obtained through such image height correction, an appropriate reconstructed image may be obtained irrespective of the position of the aperture stop of a main lens (the image pickup lens section).

In the image pickup apparatus according to the embodiment of the invention, in a pixel region corresponding to each microlens, the pitch between the light-condensing elements in the light-condensing section is smaller than the pixel size in the predetermined direction in the image pickup pixel, and in a boundary region between pixel regions corresponding to microlenses, respectively, the pitch between the light-condensing elements is larger than the pixel size in the predetermined direction in the image pickup pixel, so in the pixel region corresponding to each microlens, a luminance gradient caused by inclination of an incident light ray may be prevented. Therefore, in the case where image pickup data is obtained so as to include information on the traveling direction of light, the image quality of an image on the basis of the image pickup data may be improved.

Other and further objects, features and advantages of the invention will appear more fully from the following description.

DETAILED DESCRIPTION OF THE PREFERRED EMBODIMENTS

Preferred embodiments of the invention will be described in detail below referring to the accompanying drawings.

First Embodiment

Figure 1:
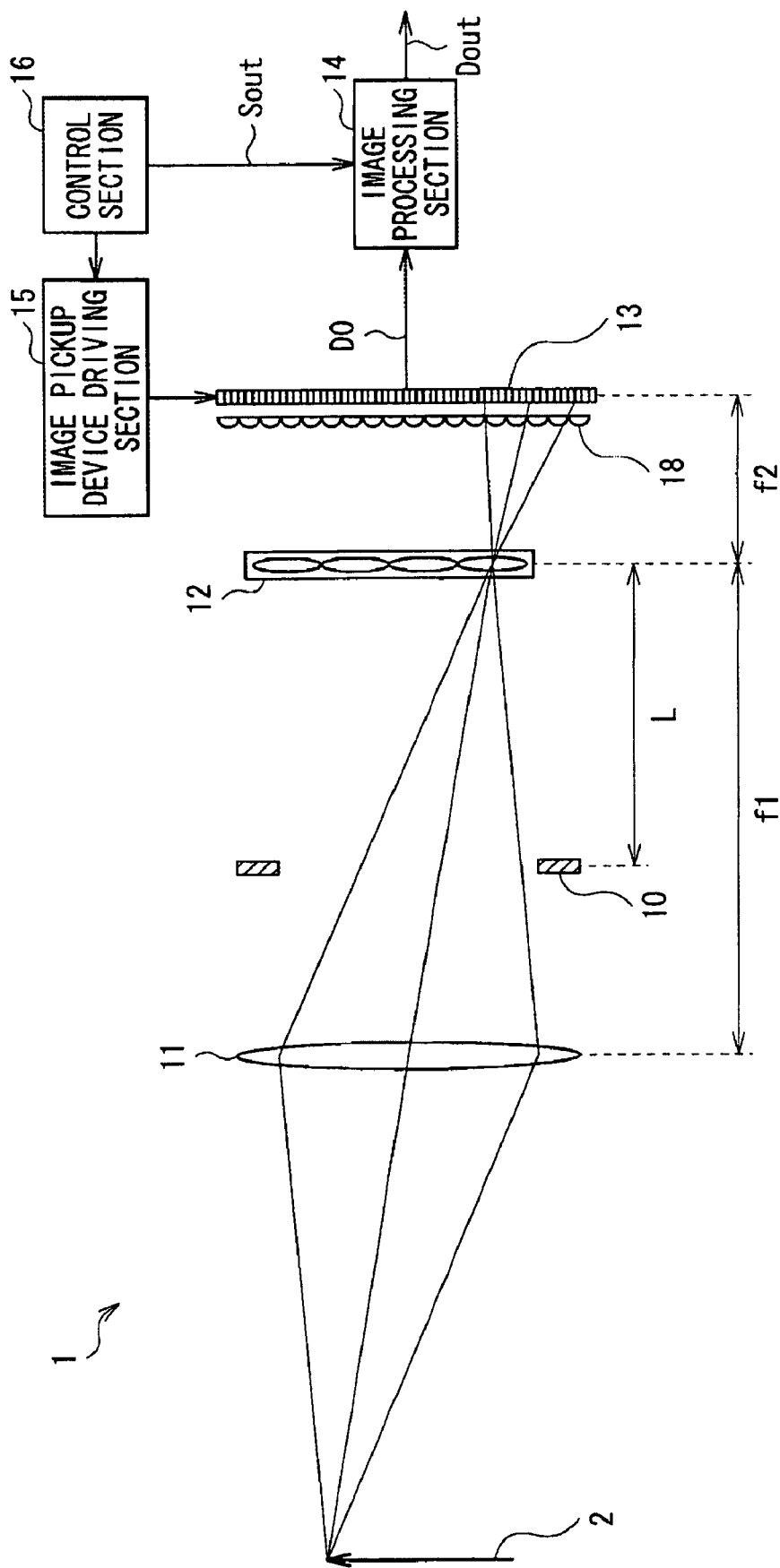
FIG. 1 is an illustration of the whole configuration of an image pickup apparatus according to a first embodiment of the invention.

FIG. 1 illustrates the whole configuration of an image pickup apparatus (an image pickup apparatus 1) according to a first embodiment of the invention. The image pickup apparatus 1 picks up an image of an object 2 to output image pickup data Dout. The image pickup apparatus 1 includes an image pickup lens 11, an aperture stop 10, a microlens array 12, an on-chip lens 18 and an image pickup device 13 in order from a side closer to the object 2. The image pickup apparatus 1 also includes an image processing section 14, an image pickup device driving section 15 and a control section 16.

The image pickup lens 11 is a main lens for picking up an image of an object, and includes, for example, a typical image pickup lens used in a video camera, a still camera or the like.

Figure 2:
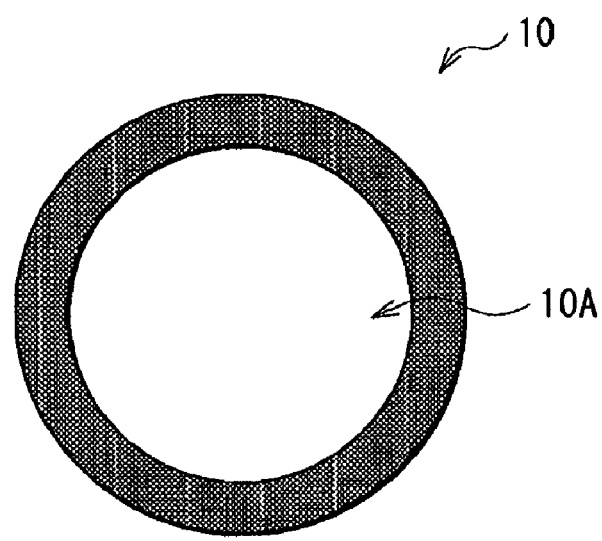
FIG. 2 is a schematic plan view of an aperture stop illustrated in FIG. 1.

The aperture stop 10 is an optical aperture stop of the image pickup lens 11. For example, as illustrated in FIG. 2, the aperture stop 10 has one circular aperture section 10A in its central part. Thereby, as will be described in detail later, all light rays passing through the aperture stop 10A keep information on the traveling direction thereof. The aperture stop 10 and the microlens array 12 are arranged to have a distance L therebetween.

Figure 3:
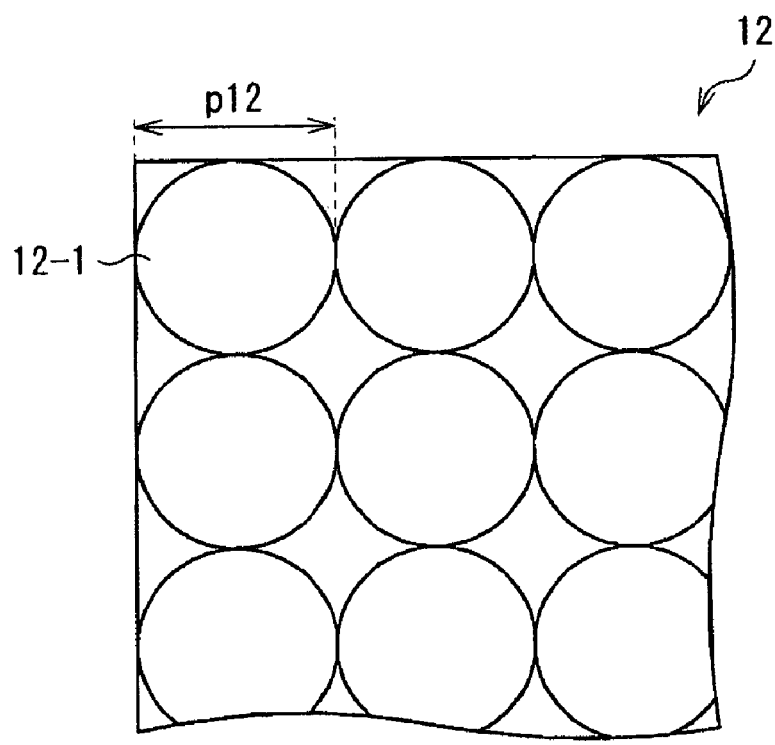
FIG. 3 is a schematic plan view of a microlens array illustrated in FIG. 1.

For example, as illustrated in FIG. 3, in the microlens array 12, a plurality of microlenses 12-1 are two-dimensionally arranged in a matrix form (the pitch between the microlenses 12-1: p12), and the microlens array 12 is arranged on an image forming plane of the image pickup lens 11 (a reference numeral f1 in the drawing denotes the focal length of the image pickup lens 11). The planar shape of each microlens 12-1 is circular, and each microlens 12-1 is made of, for example, a liquid crystal lens, a liquid lens, a diffractive lens or the like.

The image pickup device 13 detects or receives light from the microlens array 12 to obtain image pickup data D0, and is arranged on the focal plane of the microlens array 12 (a reference numeral f2 in the drawing denotes the focal length of the microlens array 12). The image pickup device 13 includes a two-dimensional image pickup device such as a plurality of CCDs (Charge Coupled Devices) or a plurality of CMOSs (Complementary Metal-Oxide Semiconductors) two-dimensionally arranged in a matrix form.

On the light-sensing plane (a plane closer to the microlens array 12) of such an image pickup device 13, M×N (M and N each are an integer) number of image pickup pixels (pixels P which will be described later) are two-dimensionally arranged in a matrix form, and a plurality of pixels P are allocated to one microlens 12-1 in the microlens array 12. The number of pixels P on the light-sensing plane is, for example, M×N=3720×2520=9374400. The number (m×n) of pixels allocated to each microlens 12-1 is related to the resolution in an arbitrary field of view of a reconstructed image, so the resolution in the arbitrary field of view of the reconstructed image increases with an increase in the values of m and n. On the other hand, the values of (M/m) and (N/n) are related to the number of pixels (the resolution) in the reconstructed image, so the number of pixels in the reconstructed image increases with an increase in the values of (M/m) and (N/n). Therefore, there is a trade-off relationship between the resolution in the arbitrary field of view of the reconstructed image and the number of pixels.

Figure 4:
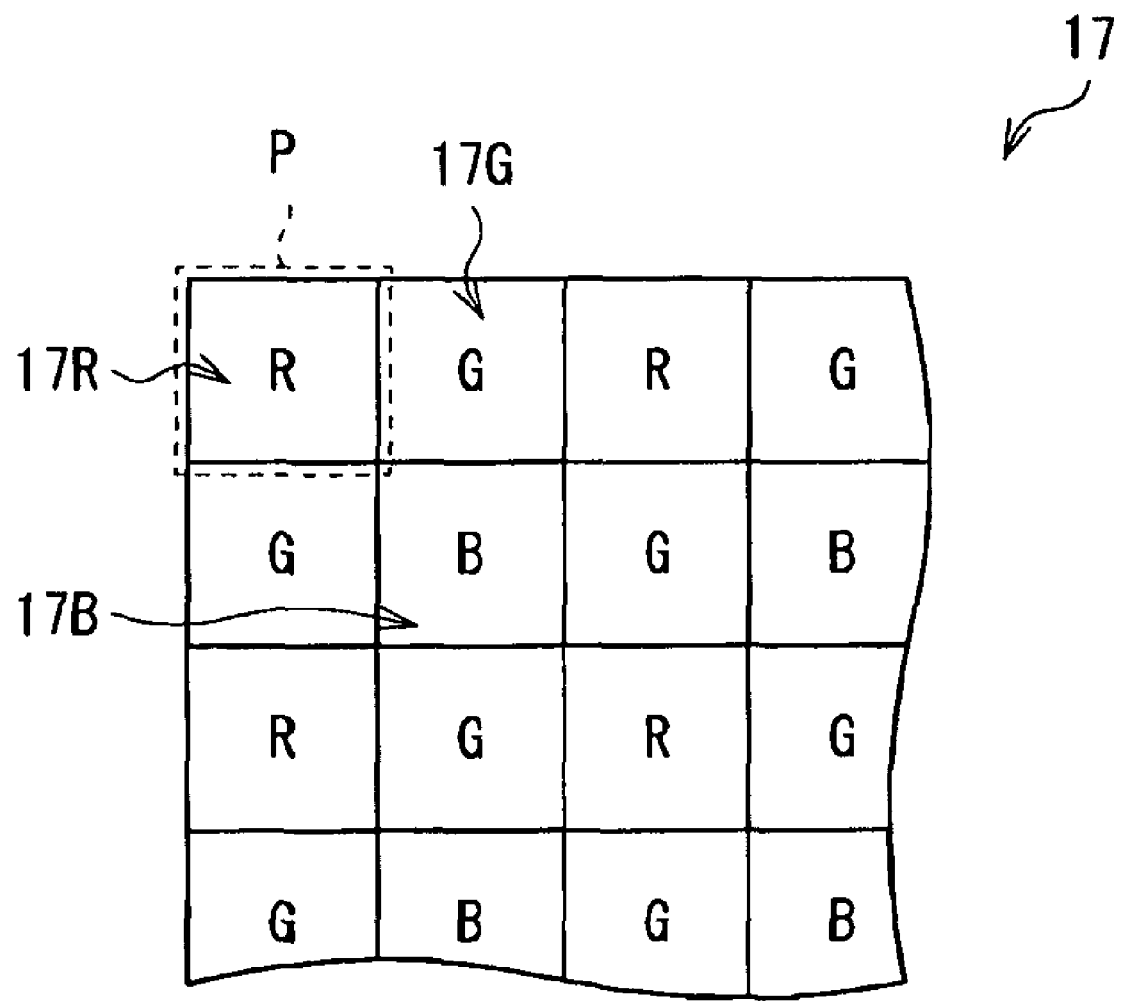
FIG. 4 is a schematic plan view of a color filter arranged on a light-sensing plane of an image pickup device.

On the light-sensing plane of the image pickup device 13, for example, a color filter 17 as illustrated in FIG. 4 is two-dimensionally arranged for each pixel P (not illustrated in FIG. 1). The color filter 17 is a color filter (a primary color filter) having a Bayer arrangement in which filters of three primary colors, that is, red (R), green (G) and blue (B) (red color filters 17R, green color filters 17G and blue color filters 17B) are arranged in a checkered pattern at a ratio of R:G:B=1:2:1. Such a color filter 17 is arranged on the light-sensing plane of the image pickup device 13, thereby the image pickup data D0 obtained by the image pickup device 13 becomes pixel data (color pixel data) of a plurality of colors (in this case, three primary colors) corresponding to the colors of the color filter 17.

The on-chip lens 18 functions as a light-condensing section which condenses light entering into the image pickup device 13 in each image pickup pixel (each pixel P which will be described later), and is arranged corresponding to each pixel P on a light-sensing plane of the image pickup device 13.

Figure 5:
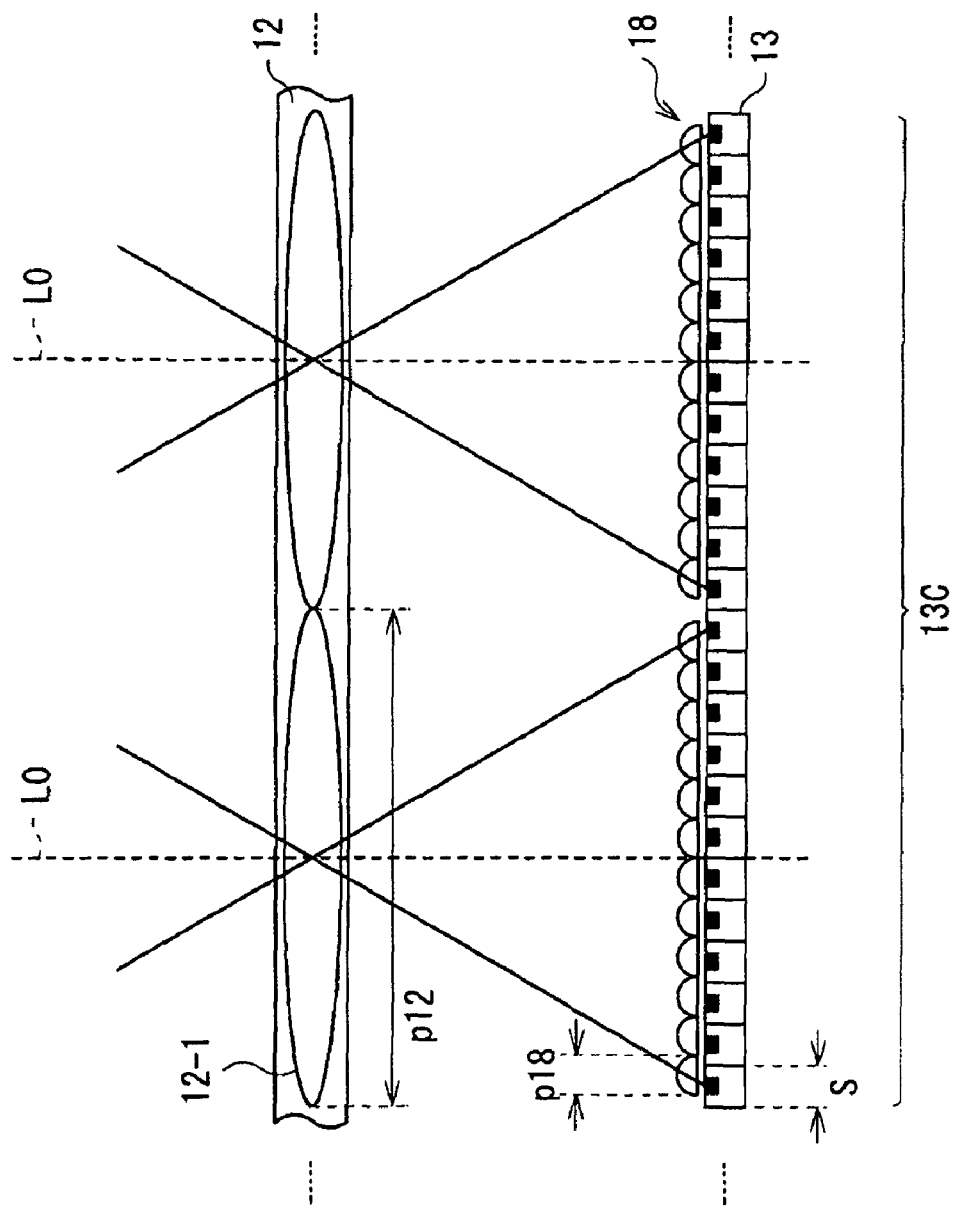
FIG. 5 is a schematic sectional view of an example of the arrangement of a microlens array, an on-chip lens and an image pickup device.
Figure 6:
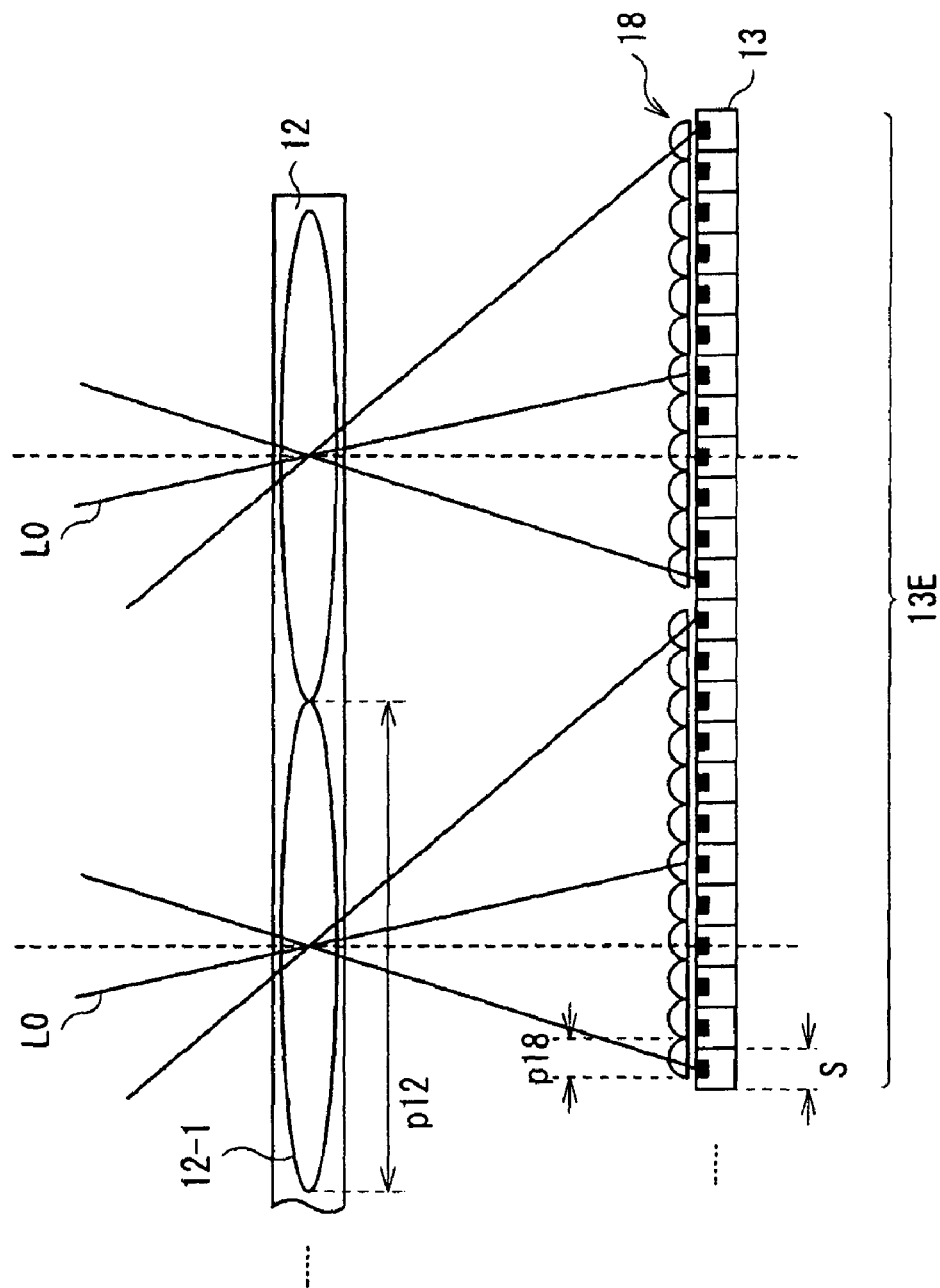
FIG. 6 is a schematic sectional view of another example of the arrangement of the microlens array, the on-chip lens and the image pickup device.

In the on-chip lens 18, for example, as illustrated in FIG. 5 (a schematic sectional configuration in a region around an optical axis peripheral region 13C corresponding to a region peripheral to the optical axis of the microlens array 12 (a region where a main light ray L0 of incident light travels substantially along the optical axis)) and FIG. 6 (a schematic sectional configuration in a region around a pixel peripheral region 13E of the image pickup device 13 (a region where the main light ray L0 of the incident light is inclined with respect to the optical axis to some extent)), on the image pickup device 13, in a pixel region corresponding to each microlens 12-1, a pitch p18 between light-condensing elements in the on-chip lens 18 is smaller than a pixel size s in the predetermined direction in the pixel P, and in a boundary region between the pixel regions corresponding to microlenses 12-1, respectively, the pitch p18 between the light-condensing elements in the one-chip lens 18 is larger than the pixel size s in the predetermined direction in the pixel P.

In both cases illustrated in FIGS. 5 and 6, in each pixel region corresponding to each microlens 12-1, the center position of the light-condensing element of the on-chip lens 18 coincides with the pixel center position of the pixel P in a central region of each of the microlenses 12-1, and is gradually shifted from the pixel center position of the pixel P with approach toward a peripheral region of each of the microlenses 12-1.

Such an on-chip lens 18 is formed by, for example, a pattern transfer process applied to a resist material. Therefore, when the pitch between photomasks is set to the above-described pitch (the pitch p18 between the light-condensing elements in the on-chip lens 12), the above-described on-chip lens 18 is formed.

The image processing section 14 performs predetermined image processing which will be described later (image processing including a sorting process) on the image pickup data D0 obtained by the image pickup device 13, and outputs image pickup data Dout obtained by performing image processing. More specifically, for example, the image processing section 14 performs refocusing arithmetic processing utilizing a technique called "Light Field Photography". Thereby, the image processing section 14 forms an image (a reconstructed image on the basis of the image pickup data Dout) focused on an arbitrary focal point. The configuration of the image processing section 14 and the operation of refocusing arithmetic processing will be described in detail later.

The image pickup device driving section 15 drives the image pickup device 13, and controls the light-sensing operation of the image pickup device 13.

The control section 16 controls the operations of the image processing section 14 and the image pickup device driving section 15, and includes, for example, a microcomputer or the like.

Figure 7:
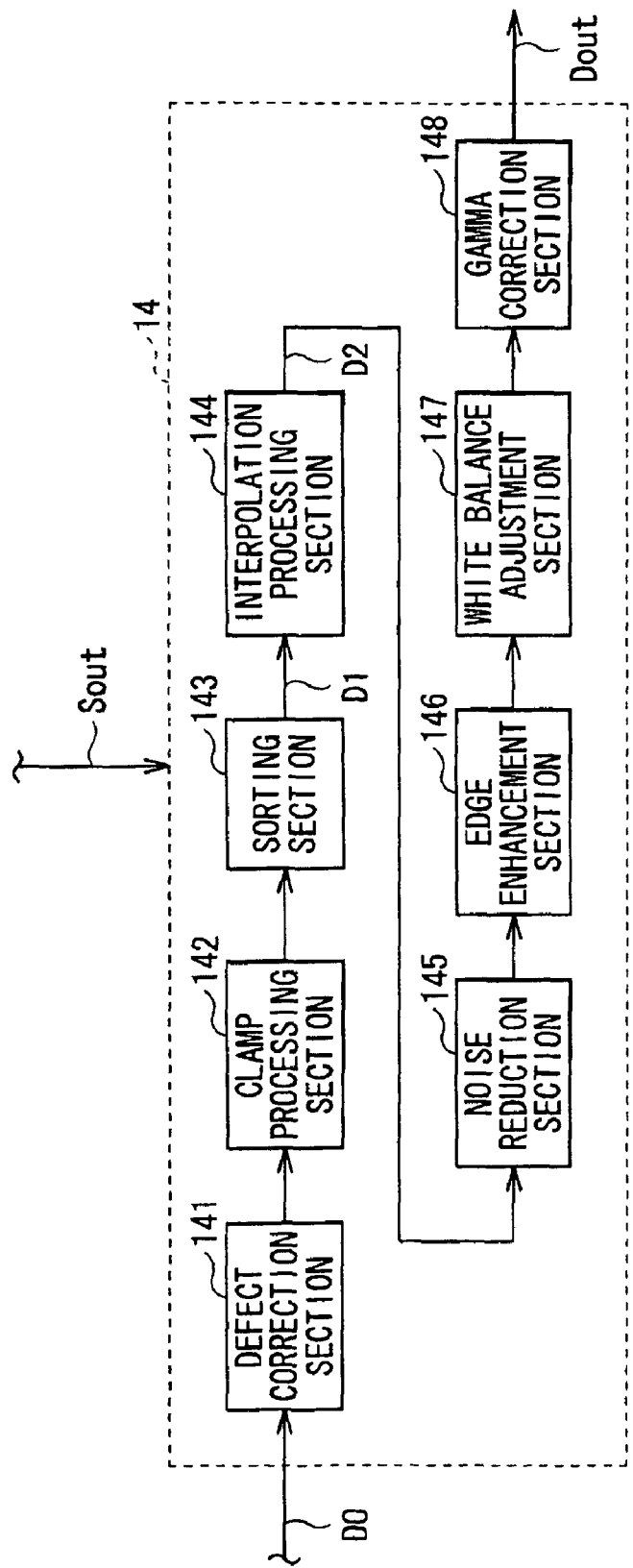
FIG. 7 is a functional block diagram of a configuration example of an image processing section illustrated in FIG. 1.

Next, the configuration of the image processing section 14 will be described in detail below referring to FIG. 7. FIG. 7 illustrates a functional block diagram of the image processing section 14.

The image processing section 14 includes a defect correction section 141, a clamp processing section 142, an interpolation processing section 143, a sorting section 144, a noise reduction section 145, an edge enhancement section 146, a white balance adjustment section 147 and a gamma correction section 148.

The defect correction section 141 corrects a defect such as loss or invalidity included in the image pickup data D0 (a defect caused by an abnormality in the image pickup device 13). The clamp processing section 142 performs a process (clamp processing) of setting the black level of each pixel data on image pickup data obtained through the defect correction by the defect correction section 142.

The interpolation processing section 143 performs interpolation processing on image pickup data supplied from the clamp processing section 142, for example, a demosaic process or the like on a typical Bayer arrangement, so as to obtain image pickup data D1.

The sorting section 144 performs a predetermined sorting process (a process of sorting pixel data) on the image pickup data D1 supplied from the interpolation processing section 143 so as to obtain image pickup data D2. When such a sorting process is performed, a reconstructed image focused on the above-described arbitrary focal point is formed. The operation of the sorting process by the sorting section 144 will be described in detail later.

The noise reduction section 145 performs a process of reducing noise (for example, noise generated when an image is picked up in a dark place or a place with insufficient sensitivity) included in the image pickup data D2 supplied from the sorting section 144. The edge enhancement section 146 performs an edge enhancement process, that is, a process of enhancing the edge of an image on image pickup data supplied from the noise reduction section 145.

The white balance adjustment section 147 performs a process (a white balance adjustment process) of adjusting color balance on image pickup data supplied from the edge enhancement section 146 (image pickup data adjusted or set so that the number of red pixel data, green pixel data and blue pixel data are equal to one another), where such color balance may be affected by an individual difference among devices such as a difference in spectral sensitivity of the image pickup device 13, by a difference in transmission characteristics of the color filter 17 or by illumination conditions.

The gamma correction section 148 performs predetermined gamma correction (tone or contrast correction) on image pickup data supplied from the white balance adjustment section 147 so as to obtain image pickup data Dout.

Next, referring to FIGS. 1 to 14, functions and effects of the image pickup apparatus 1 according to the present embodiment will be described in detail below.

First, referring to FIGS. 1 to 4, and FIGS. 7 to 14, basic functions of the image pickup apparatus 1 will be described below.

Figure 8A:
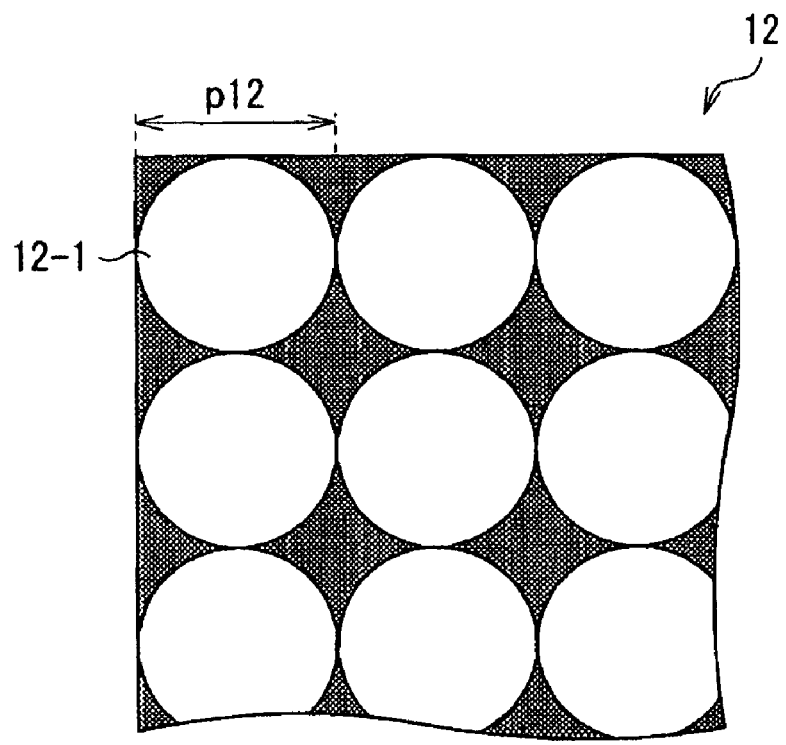
FIGS. 8A and 8B are plan views for describing image pickup patterns in the microlens array and in the image pickup device.
Figure 8B:
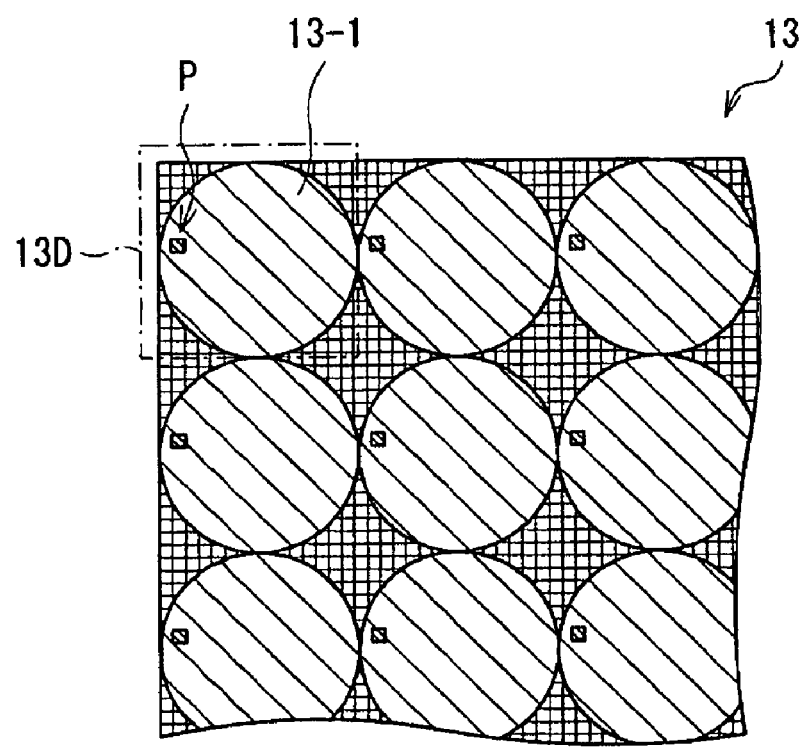

In the image pickup apparatus 1, an image of the object 2 by the image pickup lens 11 is formed on the microlens array 12 in accordance with the shape (the circular shape) of each microlens 12-l as illustrated in FIG. 8A, for example. Then, an incident light ray to the microlens array 12 reaches the image pickup device 13 through the microlens array 12, and, for example, as illustrated in FIG. 8B, the incident light ray is detected by a light-sensing region 13-1 on which the circular shape of the aperture stop 10 is projected, and the image pickup data D0 is obtained by the image pickup device 13. At this time, the incident light ray to the microlens array 12 is detected in a different position in the image pickup device 13 according to the incident direction of the incident light ray. More specifically, the incident direction of the light ray is determined by the positions of the pixels P allocated to each microlens 12-1. A region (a reconstructed pixel region 13D) where the pixels P allocated to each microlens 12-1 are arranged corresponds to one pixel of the reconstructed image.

Next, the image pickup data obtained in the image pickup device 13 is inputted into the image processing section 14. Then, in the image processing section 14, predetermined image processing (for example, the above-described refocusing arithmetic processing) is performed on the image pickup data D0, thereby the image pickup data Dout obtained through the image processing is outputted as output data (image data of the reconstructed image) of the image pickup apparatus 1.

Now, referring to FIGS. 9 to 14, the basic parts of image processing operation (refocusing arithmetic processing operation) by the image processing section 14 will be described below.

Figure 9:
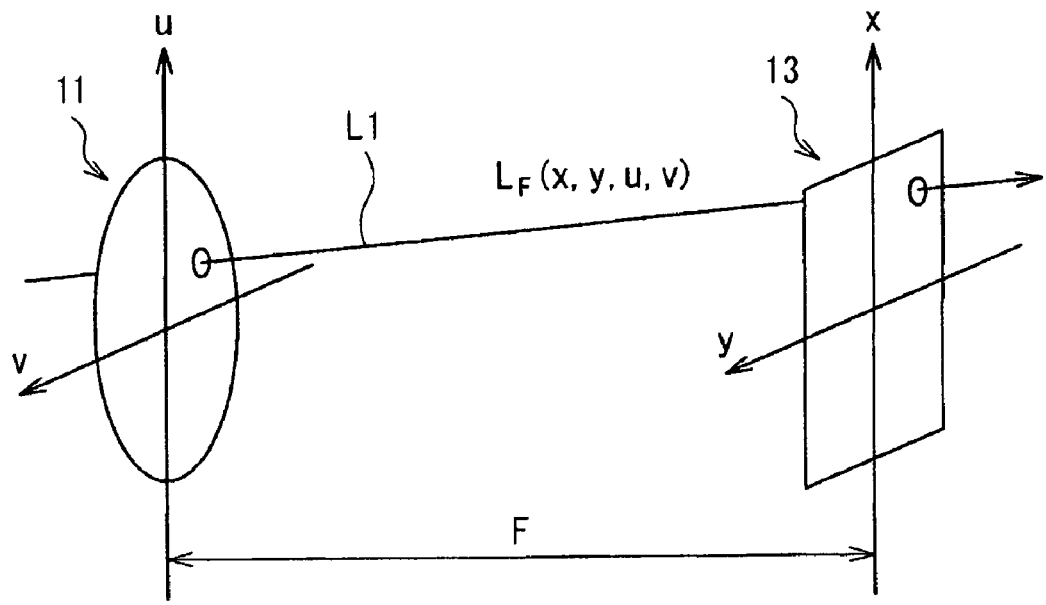
FIG. 9 is a schematic perspective view for describing an example of image processing by the image processing section.

First, as illustrated in FIG. 9, a rectangular coordinate system (u, v) is defined on an image pickup lens plane of the image pickup lens 11, and a rectangular coordinate system (x, y) is defined on an image pickup plane of the image pickup device 13. A distance between the image pickup lens plane of the image pickup lens 11 and the image pickup plane of the image pickup device 13 is defined as "F". Then, a light ray L1 passing through the image pickup lens 11 and the image pickup device 13 is represented by a four-dimensional function $L_F(x, y, u, v)$. Therefore, information on the traveling direction of the light ray L1 as well as information on the position of the light ray L1 is recorded into the image pickup device 13. In other words, the incident direction of the light ray is determined by the arrangement of the plurality of pixels P allocated to each microlens 12-1.

Figure 10:
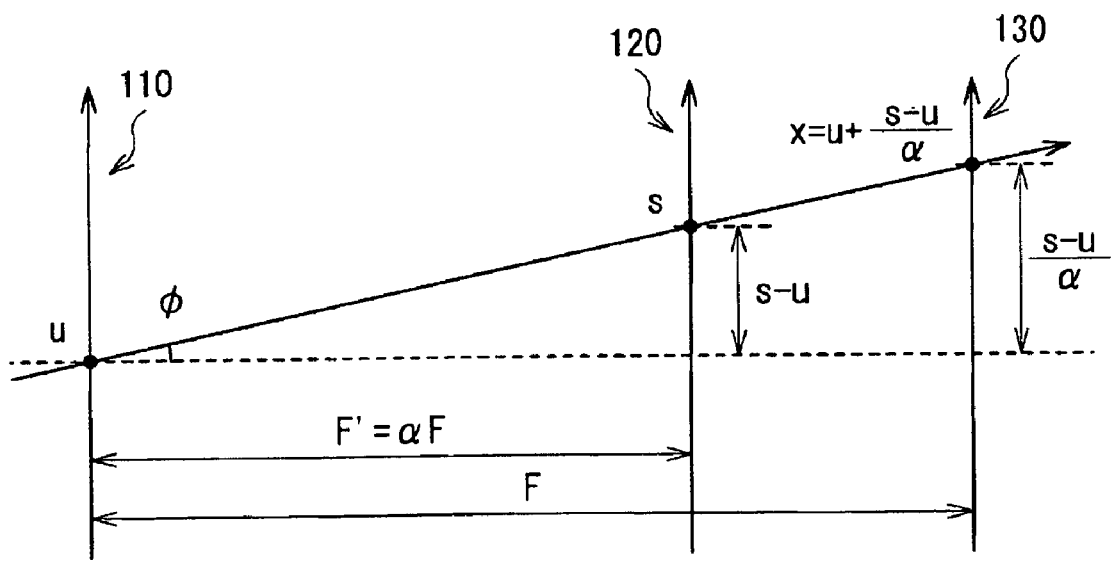
FIG. 10 is a schematic sectional view for describing refocusing arithmetic processing by the image processing section.

Also, as illustrated in FIG. 10, in the case where a positional relationship among an image pickup lens plane 110, an image pickup plane 130 and a refocus plane 120 is determined (the refocus plane 120 is determined so as to establish $F'=\alpha F$), detection intensity $L_{F'}$ on the image pickup plane 130 of coordinates (s, t) on the refocus plane 120 is represented by the following formula (1). Moreover, an image $E_{F'}(s, t)$ obtained on the refocus plane 120 is a value obtained by integrating the above-described detection intensity $L_{F'}$ with respect to a lens aperture, so the image $E_{F'}(s, t)$ is represented by the following formula (2). Therefore, when a refocusing arithmetic operation is performed on the basis of the formula (2), on the basis of the image pickup data Dout obtained by performing the image processing, an image focused on an arbitrary focal point (the refocus plane 120) is reconstructed.

Mathematical Formula 1

More specifically, in the image processing section 14, as illustrated in FIG. 5, the defect correction section 141 corrects a defect in the image pickup data D0 supplied from the image pickup device 13, and the clamping processing section 142 performs clamp processing on the image pickup data D0. Then, the interpolation processing section 143 performs interpolation processing on the image pickup data D0, and the sorting section 144 performs the sorting process of the pixel data D1. Thereby, the image pickup data D2 is produced from the image pickup data D1.

Figure 11:
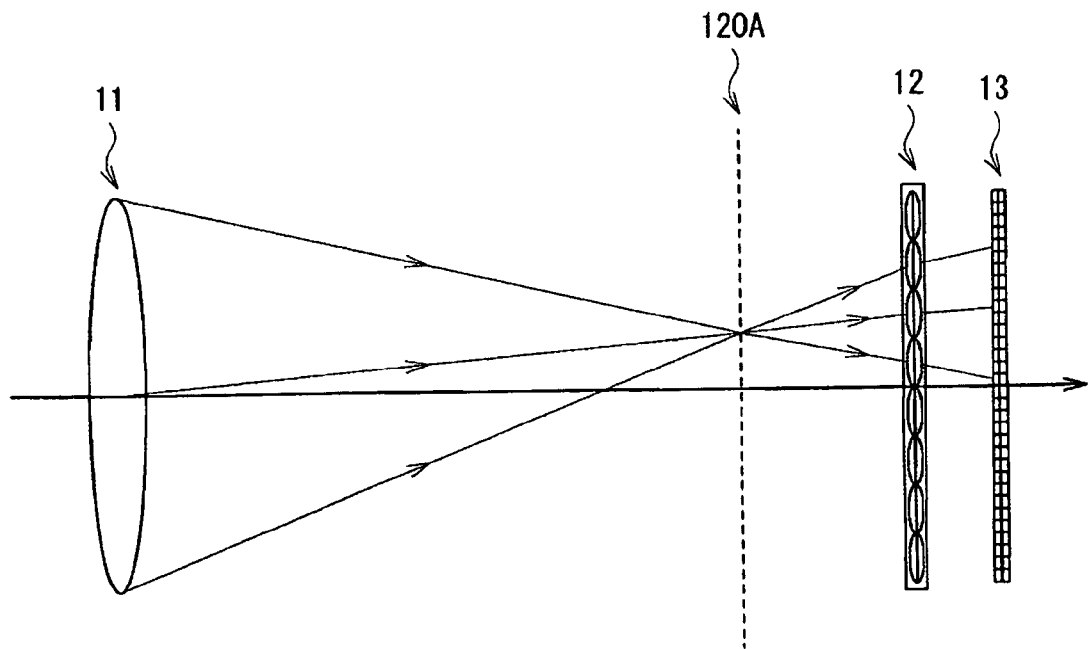
FIG. 11 is a schematic sectional view of an example of the determined position of a refocus plane in the refocusing arithmetic processing.
Figure 13:
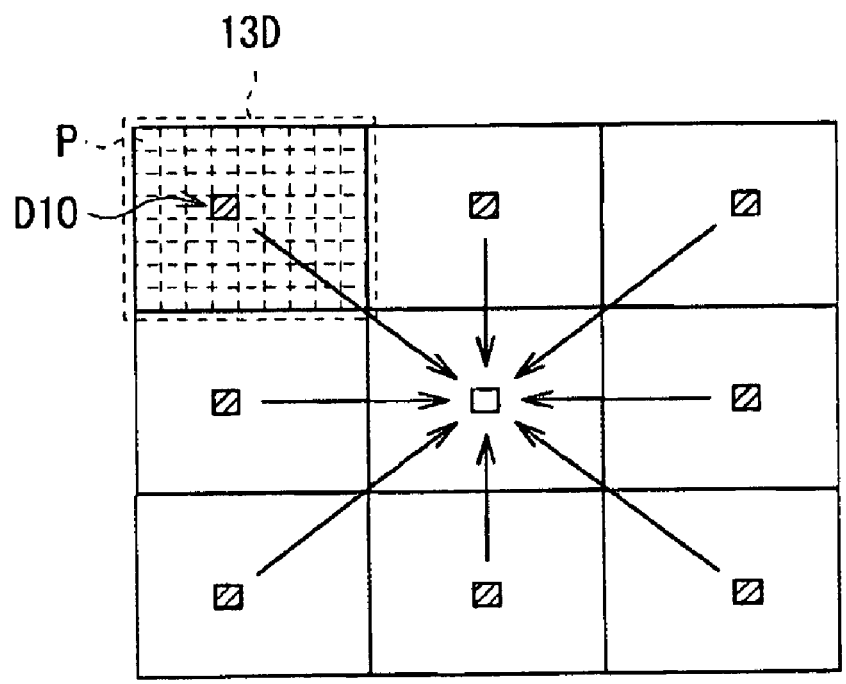
FIG. 13 is a schematic plan view of an example of a sorting process in the refocusing arithmetic processing illustrated in FIG. 11.

In this case, when a reconstructed image of which the focal point position is determined at the back of (i.e., on a farther side than) a focal point position (the position of the microlens array 12) determined when photographing is carried out is to be formed by the refocusing arithmetic processing by the image processing section 14, a sorting process in which, for example, a light ray illustrated in FIG. 11 is selectively extracted is performed. In other words, an image of which the focal point position is determined at the back of the focal point position determined at the time of the photographing is formed between the image pickup lens 11 and the microlens array 12. Thus, the light ray which is once condensed is dispersed again, and passes through a different microlens array depending on its traveling direction to reach the image pickup device 13. Therefore, for example, as illustrated in FIG. 13, a process of sorting each pixel data is performed such that pixel data D10 corresponding to such a light ray is selectively extracted from a plurality of mutually-different reconstructed pixel regions 13D.

Figure 12:
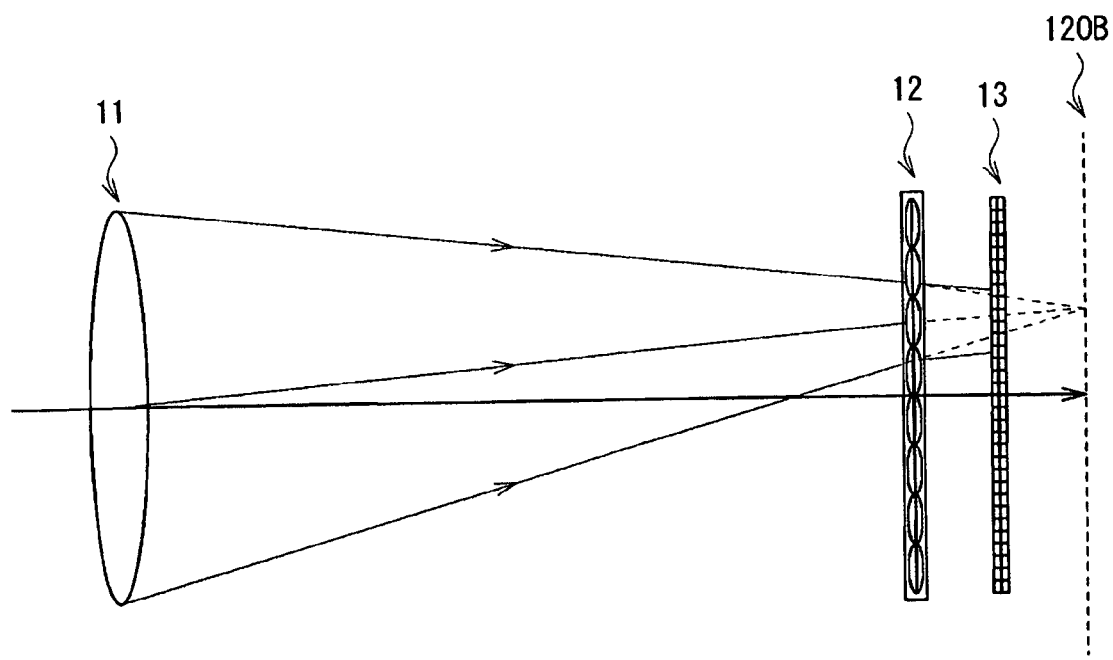
FIG. 12 is a schematic sectional view of another example of the determined position of the refocus plane in the refocusing arithmetic processing.
Figure 14:
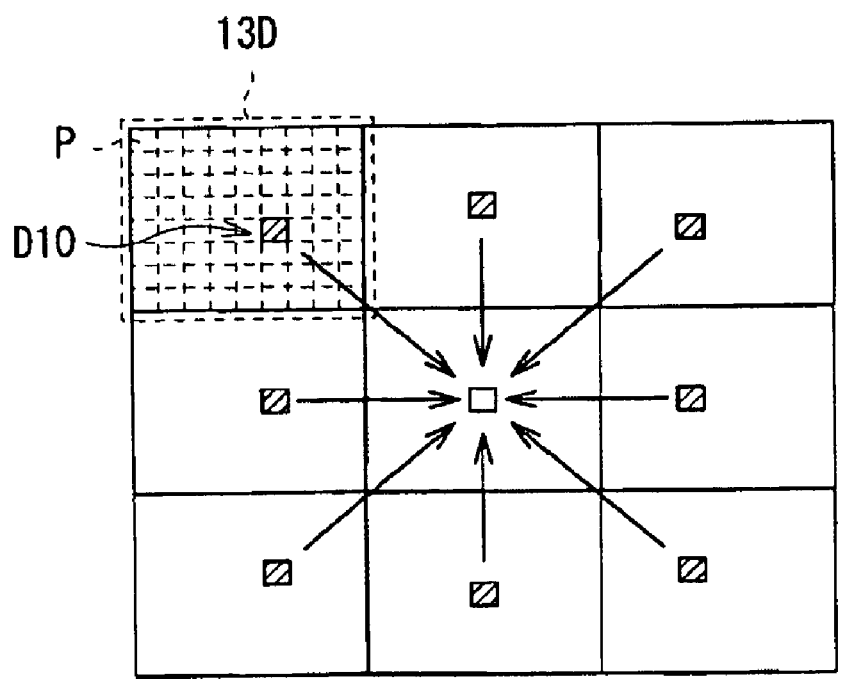
FIG. 14 is a schematic plan view of another example of the sorting process in the refocusing arithmetic processing illustrated in FIG. 12.

On the other hand, when a reconstructed image of which the focal position point is determined in front of (i.e., on a closer side than) the focal point position (the position of the microlens array 12) determined when photographing is carried out is to be formed by the refocusing arithmetic processing by the image processing section 14, a sorting process in which, for example, a light ray represented in FIG. 12 is selectively extracted is performed. In other words, an image of which the focal position point is determined in front of the focal point position determined at the time of the photographing is formed behind the microlens array 12. Thus, the image is not formed in the image pickup apparatus 1, and the light ray passes through a different microlens array depending on its traveling direction to reach the image pickup device 13. Therefore, for example, as illustrated in FIG. 14, a sorting process of each pixel data is performed such that pixel data D10 corresponding to such a light ray is selectively extracted from a plurality of mutually-different reconstructed pixel regions 13D.

Next, as illustrated in FIG. 7, the noise reduction section 145 performs the noise reduction process on the image pickup data D2 obtained through such a sorting process, and the edge enhancement section 146 performs the edge enhancement process on the image pickup data D2, and then the image pickup data D2 is supplied to the white balance adjustment section 147. Thereby, image pickup data of which color balance is adjusted is obtained. Then, the gamma correction section 148 performs the gamma correction on the image pickup data supplied from the white balance adjustment section 147, and the image pickup data is outputted from the image processing section 14 as the image pickup data Dout. Thereby, an image focused on an arbitrary focal point (the refocus plane 120) is reconstructed on the basis of the image pickup data Dout.

Next, referring to FIGS. 5 and 6, characteristic functions of the image pickup apparatus 1 according to the present embodiment will be described in detail below.

In the image pickup apparatus 1 according to the present embodiment, in consideration of light ray refraction in the microlens array 12, the center position of the on-chip lens 18 (a light-refracting configuration with a light-condensing property) formed corresponding to each pixel P of the image pickup device 13 is shifted from the pixel center position of the pixel P, for example, as illustrated in FIGS. 5 and 6.

More specifically, in a pixel region corresponding to each microlens 12-1, the pitch p18 between the light-condensing elements in the on-chip lens 18 is smaller than the pixel size s in the predetermined direction in the pixel P, and in a boundary region between the pixel regions corresponding to the microlenses 12-1, respectively, the pitch p18 between the light-condensing elements in the on-chip lens 12 is larger than the pixel size s in the predetermined direction in the pixel P. Thereby, in the pixel region corresponding to each microlens 12-1, a luminance gradient generated between pixels P around a central region of the microlens 12-1 and pixels around a peripheral region thereof due to inclination of an incident light ray is prevented.

Moreover, in both cases illustrated in FIGS. 5 and 6, in each pixel region corresponding to each microlens 12-1, the center position of the light-condensing element of the on-chip lens 18 coincides with the pixel center position of the pixel P in the central region of each of the microlenses 12-1, and is gradually shifted from the pixel center position of the pixel P with approach toward the peripheral region of each of the microlenses 12-1. Thereby, because the angle of view of the image pickup lens 11 and inclination of the main light ray L0 are also considered, the light-condensing efficiency of the incident light ray in each pixel region is enhanced, and the S/N ratio (signal-to-noise ratio) of the image pickup data D0 is improved.

As described above, in the present embodiment, in the pixel region corresponding to each microlens 12-1, the pitch p18 between the light-condensing elements in the on-chip lens 18 is smaller than the pixel size s in the predetermined direction in the pixel P, and in the boundary region between the pixel regions corresponding to microlenses 12-1, respectively, the pitch p18 between the light-condensing elements in the on-chip lens 18 is larger than the pixel size s in the predetermined direction in the pixel P, so in the pixel region corresponding to each microlens 12-1, a luminance gradient caused by inclination of the incident light ray is able to be prevented. Therefore, in the case where image pickup data is obtained so as to include information on the traveling direction of light, the image quality of an image on the basis of the image pickup data is able to be improved.

Moreover, in each pixel region corresponding to each microlens 12-1, the center position of the light-condensing element of the on-chip lens 18 coincides with the pixel center position of the pixel P in the central region of each of the microlenses 12-1, and is gradually shifted from the pixel center position of the pixel P with approach toward the peripheral region of each of the microlenses 12-1. Thus, the angle of view of the image pickup lens 11 and the inclination of the main light ray are also considered, so the light-condensing efficiency of the incident light ray in each pixel region is enhanced, and the S/N ratio (signal-to-noise ratio) of the image pickup data DO is improved. Therefore, the image quality of an image on the basis of the image pickup data is able to be further improved.

Further, a color image is taken by the image pickup device 13 through the use of the color filter 17 having the Bayer arrangement illustrated in FIG. 4, and color interpolation processing (for example, the demosaic process in a unit image or a plurality of unit images) is performed by the interpolation processing section 143 in the image processing section 14. In an image pickup apparatus in related art, color interpolation processing may not be properly performed due to a luminance gradient generated in a unit image, thereby this may cause color shift, or color unevenness. In contrast; in the image pickup apparatus 1 according to the present embodiment, when taking such a color image, the occurrence of color shift, or color unevenness may be prevented, and color reproducibility may be improved.

Second Embodiment

Next, a second embodiment of the invention will be described below. Like components are denoted by like numerals as of the first embodiment, and will not be further described.

In the microlens array 12 according to the present embodiment, when the pitch between the microlenses 12-1 is "p12", when the pixel size in a predetermined direction in an image pickup pixel (the pixel P which will be described later) of the image pickup device 13 is "s", when the number of pixels P allocated to each microlens 12-1 in the predetermined direction is "m" (an integer), when a distance between the aperture stop 10 and the microlens array 12 as described above is "L", and when the focal length of each of the microlenses 12-1 is "f2", the pitch p12 between the microlenses 12-1 is represented by the following formula (11).

$$p12=(m \times s) \times \{L/(L+f2)\} \tag{11}$$

Figure 15:
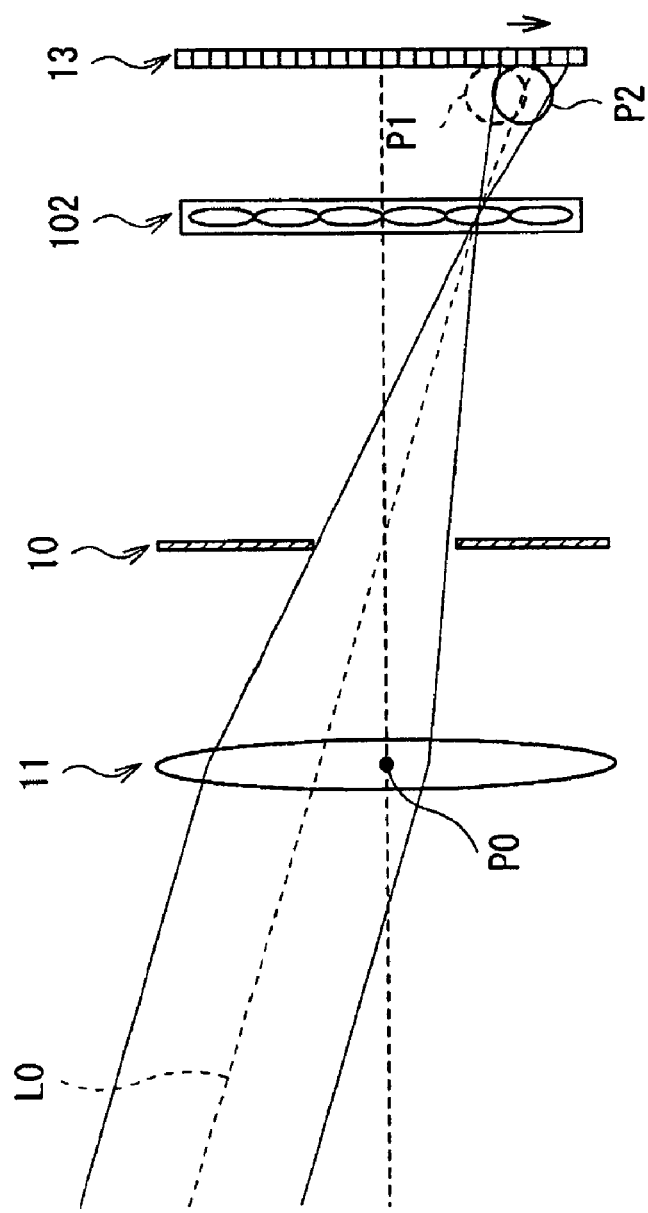
FIG. 15 is an illustration for describing image height deviation in an image pickup apparatus of a comparative example according to a second embodiment of the invention.
Figure 16:
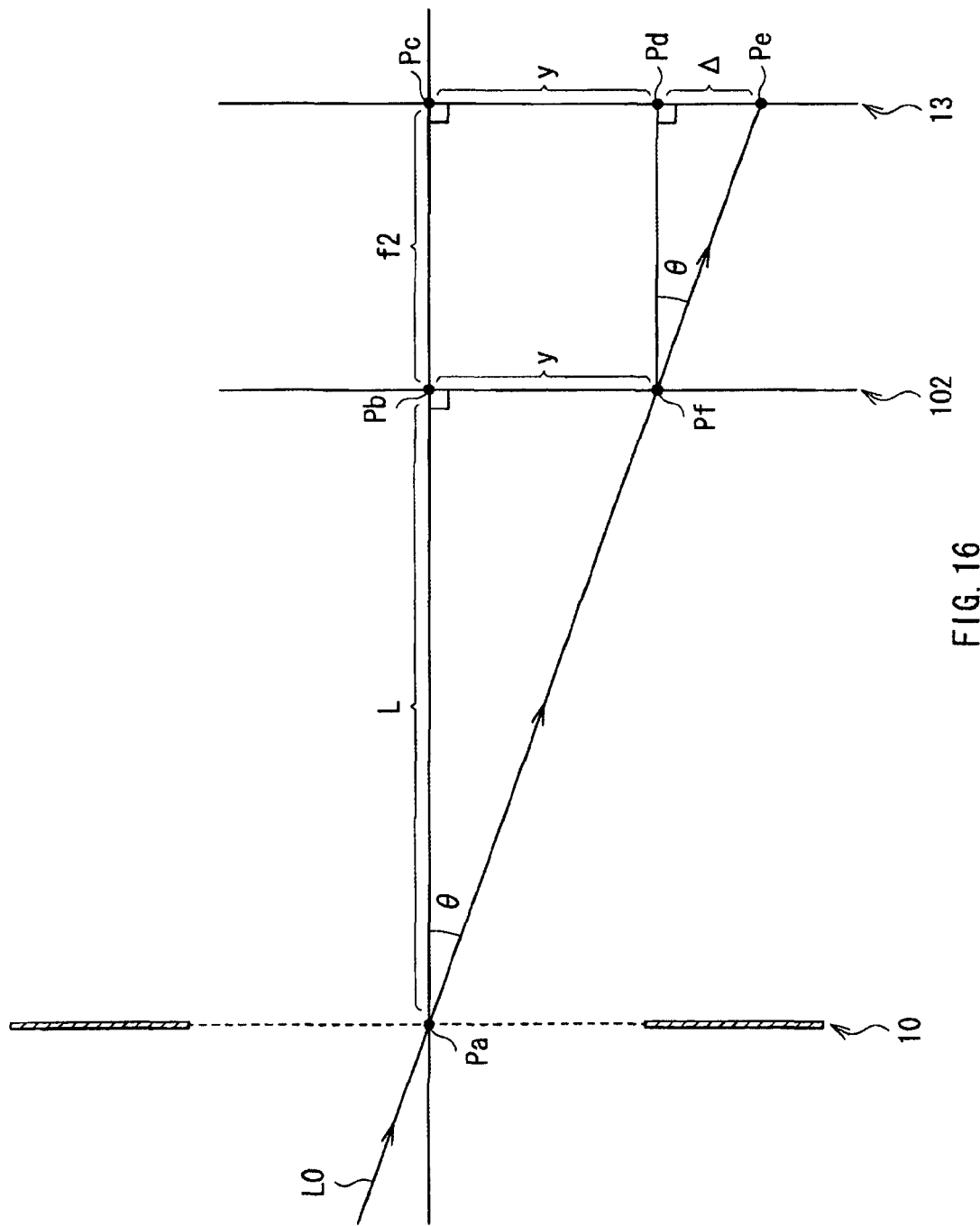
FIG. 16 is a schematic view for describing the image height deviation in the image pickup apparatus of the comparative example according to the second embodiment.

Now, referring to FIGS. 15 and 16, characteristic functions of the image pickup apparatus according to the present embodiment will be described in detail in comparison with a comparative example. FIGS. 15 and 16 illustrate a state of image pickup in the case where image height deviation occurs (the case of the image height deviation amount Δ>0) in an image pickup apparatus according to the comparative example (including a microlens array 102 in which the pitch p12 between the microlenses 12-1 does not satisfy the above-described formula (1), instead of the microlens array 12 in the image pickup apparatus 1).

First, for example, as illustrated in FIG. 15, in the case where the position of the aperture stop 10 of the image pickup lens 11 as a main lens has some distance from a principal point P0 of the image pickup lens 11, when a main light ray L0 of incident light into the microlens array 12 is inclined with respect to an optical axis to some extent (in the case where the main light ray L0 is not present on the principal point P0 of the image pickup lens 11), the pitch between images (unit images) formed on the image pickup device 13 in accordance with the shapes (circular shapes) of the microlenses 12-1 is shifted from a position P1 to a position P2 as indicated by an arrow in the drawing, depending on the position of the aperture stop 10.

Thereby, for example, as illustrated in FIG. 16, the image height deviation by an image height deviation amount Δ (a distance between a point Pd and a point Pe) occurs in the light-sensing plane (a plane on a side closer to the microlens array 12) of the image pickup device 13. The image height deviation amount Δ is represented by the following formulas (12) and (13), where an inclined angle between the optical axis and the main light ray L0 is "θ", an image height (a distance between a point Pb and a point Pf) of an image of the main light ray L0 formed on the microlens array 102 is "y", a distance between the aperture stop 10 and the microlens array 12 (a distance between a point Pa and the point Pb) is "L", and the focal length of the microlens array 12 (a distance between the point Pb and a point Pc) is "f2". Moreover, a ratio between the image height y on the microlens array 12 and the image height of a unit image formed on the image pickup device 13 (a distance between the point Pc and the point Pe) is represented by the following formula (14).

$$\tan \theta = (y/L) = (\Delta/f2) \tag{12}$$

$$\Delta = \{(y \times f2)/L\} \tag{13}$$

$$(y+\Delta)/y = (L+f2)/L \tag{14}$$

Thus, in the image pickup apparatus according to the comparative example illustrated in FIGS. 15 and 16, since the pitch p12 between the microlenses 12-1 in the microlens array 102 does not satisfy the above-described formula (11), the image height deviation by the image height deviation amount A represented by the above-described formulas (12) and (13) consequently occurs. In other words, as described above, even in the case where the image pickup data D0 obtained by the image pickup device 13 includes information on the traveling direction of light as well as light intensity distribution, the pitch p12 between the microlenses 12-1 is not equal to an integral multiple of the pixel P of the image pickup device 13. Therefore, the number of pixels P allocated to each microlens 12-1 in the predetermined direction changes, and in the image processing section 14, a reconstructed image such as a refocused image or an arbitrary viewpoint image may not be obtained.

On the other hand, in the image pickup apparatus 1 according to the present embodiment, in the microlens array 12, the pitch p12 between the microlenses 12-1 satisfies the above-described formula (11). Thereby, the value of an image height correction factor (corresponding to an inverse of the above-described formula (14)) according to the above-described comparative example is constantly "1". Therefore, in the image pickup data D0 obtained by the image pickup device 13, the occurrence of image height deviation (image height deviation by the image height deviation amount Δ) in the light-sensing plane (a plane on a side closer to the microlens array 12) of the image pickup device 13 is prevented.

As described above, in the present embodiment, the pitch p12 between the microlenses 12-1 satisfies the above-described formula (11). Thus, in the image pickup data D0 obtained by the image pickup device 13, the occurrence of image height deviation in the light-sensing plane of the image pickup device 13 may be prevented. Therefore, when a reconstructed image is formed by the image processing section 14 through the use of such image pickup data D0, an appropriate reconstructed image may be formed in addition to effects in the first embodiment.

Moreover, unlike a third embodiment which will be described below, in the present embodiment, it is not necessary to arrange an image height correction section (an image height correction section 149 which will be described later) performing image height correction, and the present embodiment is achieved only by setting the pitch p12 between the microlenses 12-1, so unless otherwise the position of the aperture stop 10 determined when designing the pitch between the microlenses 12-1 is displaced, an appropriate reconstructed image is able to be formed easily.

Third Embodiment

Next, the third embodiment of the invention will be described below. An image pickup apparatus according to the present embodiment has the same configuration as that of the image pickup apparatus according to the second embodiment, except that the image pickup apparatus includes an image processing section 14A which will be described below instead of the image processing section 14 of the image pickup apparatus according to the second embodiment, and that a microlens array (corresponding to the above-described microlens array 102) in which the pitch p12 between the microlenses 12-1 does not satisfy the above-described formula (11) is provided instead of the microlens array 12 described in the second embodiment. Therefore, like components are denoted by like numerals as of the second embodiment, and will not be further described.

Figure 17:
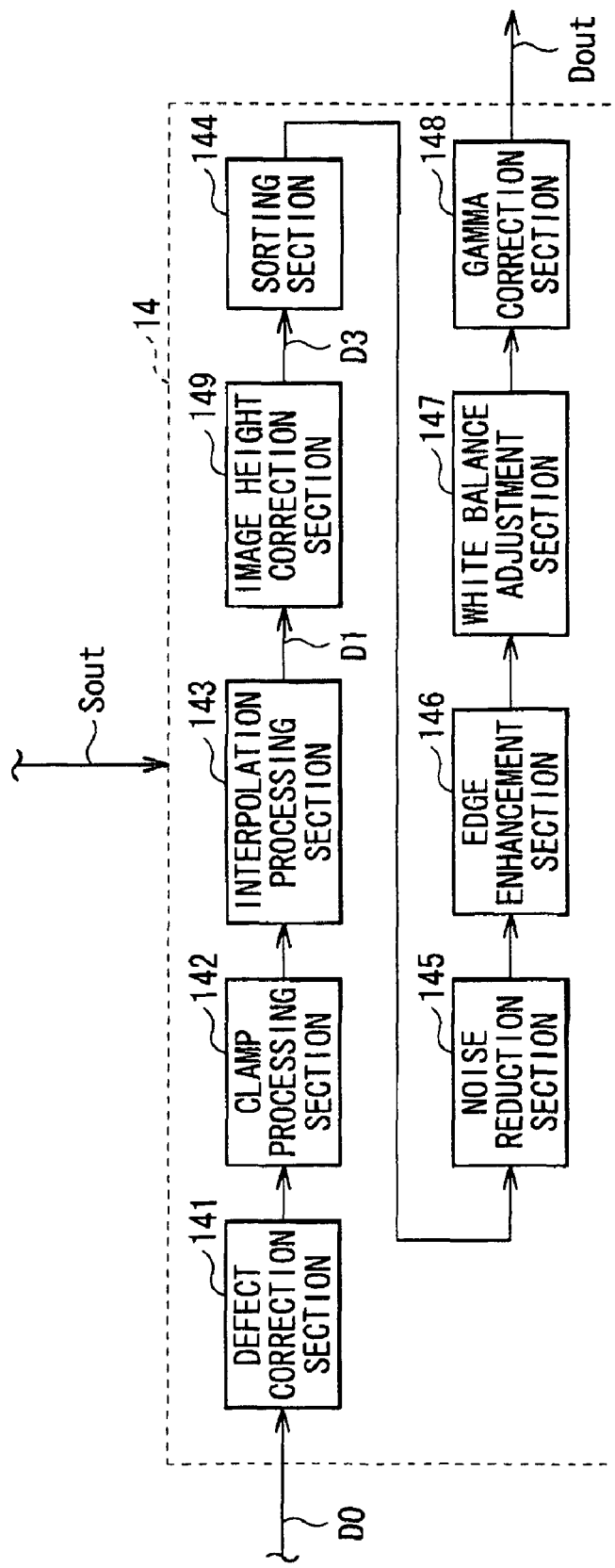
FIG. 17 is a functional block diagram of a configuration example of an image processing section according to a third embodiment of the invention.

FIG. 17 illustrates a functional block diagram of an image processing section (an image processing section 14A) used in the image pickup apparatus according to the present embodiment. The image processing section 14A differs from the image processing section 14 described in the first embodiment, in a configuration that an image height correction section 149 is arranged between the interpolation processing section 143 and the sorting section 144.

The image height correction section 149 performs image height correction on image pickup data obtained by the image pickup device 13 (more specifically, image pickup data D1 obtained by performing interpolation processing by the interpolation processing section 143) so that an image size in the predetermined direction (corresponding to the pitch p12 between the microlenses 12-1) of an image (a unit image) formed on the image pickup device 13 corresponding to each microlens 12-1 is equal to an integral multiple of the pixel size s in the predetermined direction of the pixel P of the image pickup device 13. Thereby image pickup data D3 is obtained through the image height correction, and the image pickup data D3 is supplied to the sorting section 144. More specifically, the image height correction section 149 performs image height correction on the image pickup data D1 through the use of a correction factor k represented by the following formulas (15) and (16) (the image height correction section 149 obtains the image pickup data D3 by multiplying the image pickup data D1 by the correction factor k). Here, in the case of β=1, p12=m×s is established by the formula (16).

$$k = \beta \times \{L/(L+f/2)\} \quad (15)$$

$$\beta = (m \times s)/p12 \quad (16)$$

In such a configuration, in the present embodiment, the image height correction section 149 performs the image height correction on the image pickup data D1 so that an image size in the predetermined direction (corresponding to the pitch p12 between the microlenses 12-1) of an image (a unit image) formed on the image pickup device 13 corresponding to the microlens 12-1 is equal to an integral multiple of the pixel size s in the predetermined direction of the pixel P. Thus, in the image pickup data D3 obtained through such image height correction, irrespective of the position of the aperture stop 10 (a distance L between the aperture stop 10 and the microlens array 12), image height deviation (image height deviation by the image height deviation amount Δ) in the light-sensing plane (a plane on a side closer to the microlens array 12) of the image pickup device 13 does not occur. Therefore, when a reconstructed image is formed by the image processing section 14A through the use of image pickup data D3 obtained by performing the image height correction, as in the case of the second embodiment, in addition to effects in the first embodiment, an appropriate reconstructed image is able to be formed irrespective of the position of the aperture stop 10 of the main lens (the image pickup lens 11).

Although the present invention is described referring to the first, second and third embodiments, the invention is not limited to the embodiments, and may be variously modified.

For example, in the second embodiment, the case where the pitch p 12 between the microlenses 12-1 satisfies the above-described formula (11) is described, and in the third embodiment, the case where image height correction is performed by the image height correction section 149 is described. However, for example, the configurations described in the second and third embodiments may be combined. More specifically, the pitch p12 between the microlenses 12-1 may satisfy the above-described formula (11), as well as the image height correction may be performed by the image height correction section 149.

Moreover, in the above-described embodiments, the image processing sections 14 and 14A are described as components of the image pickup apparatus. However, the image processing section is not necessarily arranged in the image pickup apparatus. More specifically, the image processing section may be arranged in an apparatus other than the image pickup apparatus, for example, a PC (Personal Computer) or the like, and image pickup data obtained in the image pickup apparatus may be transferred to the PC to perform image processing on the image pickup data in the PC.

Further, in the above-described embodiments, the aperture stop is arranged on an image side (an emission side) of the image pickup lens. However, the invention is not limited to this, and the aperture stop may be arranged on an object side (an incident side) of the image pickup lens or in the image pickup lens.

In the above-described embodiments, the on-chip lens 18 is described as an example of the light-condensing section formed on a light ray incident side of each pixel P. However, such a light-condensing section may be achieved by any other light-refracting configuration, a light guide configuration or the like.

In the above-described embodiments, as an example of the color filter, the color filter having the Bayer arrangement in which the filters of three primary colors, that is, red (R), green (G) and blue (B) are arranged in the checkered pattern at the ratio of R:G:B=1:2:1 is described. However, a color filter having any other arrangement may be used. For example, a color filter (a complimentary filter) having an arrangement in which filters of four complimentary colors, that is, yellow (Y), magenta (M), cyan (C) and green (G) (yellow color filters, magenta color filters, cyan color filters and green color filters) are arranged in a checkered pattern at a ratio of Y:M:C:G=1:1:1:1 may be used.

In the above-described embodiments, a demosaic process is described as an example of the interpolation processing of pixel data in the image pickup data; however, any other interpolation processing may be performed.

In the above-described embodiments, as an example of the image processing including the sorting process performed in the image processing section 14, the refocusing arithmetic processing using "Light Field Photography" is described. However, the image processing including such a sorting process is not limited to this, and, for example, focus blur processing, depth of field adjustment processing or the like may be used.

It should be understood by those skilled in the art that various modifications, combinations, sub-combinations and alterations may occur depending on design requirements and other factors insofar as they are within the scope of the appended claims or the equivalents thereof.

What is claimed is:
1. An image pickup apparatus comprising:
an image pickup lens section;
an image pickup device obtaining image pickup data on the basis of light detected;
a microlens array section arranged on a focal plane of the image pickup lens section between the image pickup lens section and the image pickup device, and including a plurality of microlenses, each of the microlenses being provided corresponding to a plurality of image pickup pixels of the image pickup device; and
a light-condensing section configured of a plurality of light-condensing elements, each of the light-condensing elements condensing light entering into each of the image pickup pixels of the image pickup device,
wherein on the image pickup device, in a pixel region corresponding to each microlens, the pitch between the light-condensing elements in the light-condensing section is smaller than the pixel size in a predetermined direction in the image pickup pixel, and in a boundary region between pixel regions corresponding to microlenses, respectively, the pitch between the light-condensing elements is larger than the pixel size in the predetermined direction in the image pickup pixel, wherein
the image pickup lens section includes an aperture stop, and satisfies the following formula (1), $$p = (m \times s) \times \{L/(L+f)\} \quad (1)$$

where p is a pitch between the microlenses, s is a pixel size in the predetermined direction, m is the number (an integer) of the image pickup pixels allocated to each of the microlenses in the predetermined direction, L is a distance between the aperture stop and the microlens array section, and f is a focal length of each of the microlenses.

2. The image pickup apparatus according to claim 1, wherein
in each pixel region corresponding to each of the microlenses, the center position of the light-condensing element coincides with the pixel center position of the image pickup pixel in a central region of each of the microlenses, and is gradually shifted from the pixel center position of the image pickup pixel with approach toward a peripheral region of each microlens.

3. The image pickup apparatus according to claim 1, further comprising:
an image processing section performing predetermined image processing on the image pickup data obtained by the image pickup device.

4. The image pickup apparatus according to claim 1, wherein the image pickup apparatus includes:
an image height correction section performing image height correction on the image pickup data obtained by the image pickup device so that an image size, in the predetermined direction, of an image formed on the image pickup device by each of the microlenses is equal to an integral multiple of a pixel size, in the predetermined direction, of the image pickup pixel.

5. An image pickup apparatus comprising:
an image pickup lens section;
an image pickup device obtaining image pickup data on the basis of light detected;
a microlens array section arranged on a focal plane of the image pickup lens section between the image pickup lens section and the image pickup device, and including a plurality of microlenses, each of the microlenses being provided corresponding to a plurality of image pickup pixels of the image pickup device; and
a light-condensing section configured of a plurality of light-condensing elements, each of the light-condensing elements condensing light entering into each of the image pickup pixels of the image pickup device,
wherein on the image pickup device, in a pixel region corresponding to each microlens, the pitch between the light-condensing elements in the light-condensing section is smaller than the pixel size in a predetermined direction in the image pickup pixel, and in a boundary region between pixel regions corresponding to microlenses, respectively, the pitch between the light-condensing elements is larger than the pixel size in the predetermined direction in the image pickup pixel,
wherein
the image pickup lens section includes an aperture stop, and
the image pickup apparatus includes:
an image height correction section performing image height correction on the image pickup data obtained by the image pickup device so that an image size, in the predetermined direction, of an image formed on the image pickup device by each of the microlenses is equal to an integral multiple of a pixel size, in the predetermined direction, of the image pickup pixel,
wherein
the image height correction section performs the image height correction on the image pickup data through the use of a correction factor k represented by the following formulas (2) and (3), $$k = \beta \times \{L/(L+f)\} \quad (2)$$

$$\beta = (m \times s)/p \quad (3)$$

where p is a pitch between the microlenses, s is a pixel size in the predetermined direction, m is the number (an integer) of the image pickup pixels allocated to each of the microlenses in the predetermined direction, L is a distance between the aperture stop and the microlens array section, and f is a focal length of each of the microlenses.

6. The image pickup apparatus according to claim 5, wherein
in each pixel region corresponding to each of the microlenses, the center position of the light-condensing element coincides with the pixel center position of the image pickup pixel in a central region of each of the microlenses, and is gradually shifted from the pixel center position of the image pickup pixel with approach toward a peripheral region of each microlens.

7. The image pickup apparatus according to claim 5, further comprising:
an image processing section performing predetermined image processing on the image pickup data obtained by the image pickup device.

* * * * *